United States Patent [19]

Yamaji et al.

[11] Patent Number: 5,401,688
[45] Date of Patent: Mar. 28, 1995

[54] SEMICONDUCTOR DEVICE OF MULTICHIP MODULE-TYPE

[75] Inventors: Yasuhiro Yamaji, Kawasaki; Yoichi Hiruta, Matsudo; Tsutomu Nakazawa, Yokohama; Katsuto Katoh, Tokyo; Yoshihiro Atsumi; Naohiko Hirano, both of Yokohama; Akihiro Mase, Tokyo, all of Japan

[73] Assignee: Kabushiki Kaisha Toshiba, Kawasaki, Japan

[21] Appl. No.: 118,786

[22] Filed: Sep. 9, 1993

Related U.S. Application Data

[62] Division of Ser. No. 836,657, Feb. 18, 1992, abandoned.

[30] Foreign Application Priority Data

Feb. 18, 1991 [JP] Japan .................... 3-023279

[51] Int. Cl.$^6$ ............................ H01L 21/60
[52] U.S. Cl. .................... 437/209; 437/205; 437/214; 437/217; 437/220
[58] Field of Search ............ 357/74; 257/679; 361/414; 437/209, 205, 195, 214, 217, 220

[56] References Cited

U.S. PATENT DOCUMENTS

| | | | |
|---|---|---|---|
| 4,380,699 | 4/1983 | Monnier et al. | 235/492 |
| 4,514,785 | 4/1985 | Parmentier | 361/401 |
| 4,731,645 | 3/1988 | Parmentier et al. | 357/80 |
| 4,736,521 | 4/1988 | Dohya | 29/830 |
| 4,837,408 | 6/1989 | Kondo et al. | 174/68.5 |
| 4,843,225 | 7/1989 | Hoppe | 235/492 |
| 4,850,105 | 7/1989 | Nakajima et al. | 29/841 |
| 4,874,721 | 10/1989 | Kimura et al. | 437/209 |
| 4,918,811 | 4/1990 | Eichelberger et al. | 437/209 |
| 4,922,325 | 5/1990 | Smeltz, Jr. | 357/74 |
| 4,931,853 | 6/1990 | Ohuchi et al. | 357/74 |
| 4,931,906 | 6/1990 | Reifel et al. | 361/386 |
| 4,941,033 | 7/1990 | Kishida | 357/75 |
| 4,949,163 | 8/1990 | Sudo et al. | 357/80 |
| 5,039,628 | 8/1991 | Carey | 437/209 |
| 5,060,049 | 10/1991 | Yamasaki et al. | 357/70 |
| 5,093,708 | 3/1992 | Solomon | 437/209 |
| 5,103,293 | 4/1992 | Bonafino et al. | 357/80 |
| 5,117,068 | 5/1992 | Seieroe et al. | 174/52.4 |
| 5,192,716 | 3/1993 | Jacobs | 437/205 |
| 5,206,188 | 4/1993 | Hiroi et al. | 437/220 |

FOREIGN PATENT DOCUMENTS 0296745 12/1986 Japan ...................... 357/74

Primary Examiner—Brian E. Hearn
Assistant Examiner—Kevin M. Picardat
Attorney, Agent, or Firm—Foley & Lardner

[57] ABSTRACT

A semiconductor chip is packaged within film carriers which serve as the enclosure of the semiconductor chip. The finished semiconductor device is flexible, bendable, and very thin. In manufacturing this semiconductor device, the process of laminating film carriers, the process of electrically connecting the semiconductor chip and film carriers, and the process of sealing the semiconductor chip, can be performed at the same time, shortening the manufacturing time and reducing manufacturing cost.

7 Claims, 7 Drawing Sheets

SEMICONDUCTOR DEVICE OF MULTICHIP MODULE-TYPE

This application is a division of application Ser. No. 07/836,657, filed Feb. 18, 1992, now abandoned.

BACKGROUND OF THE INVENTION

The present invention relates to a semiconductor device, and more particularly to the package structure of a multi-chip module.

Recently, multi-chip modules are being widely used. Each multi-chip module has a plurality of semiconductor chips within one package. The package structure of a conventional multi-chip module is shown in FIG. 10. A semiconductor chip 102 is mounted on a printed circuit carrier 101 by connecting a bonding pad 103 to a pattern electrode 104 on the carrier 101, using a bonding wire 105. Semiconductor chips 106 and 116 are mounted on the carrier 101 by connecting their electrode pads 107 and 117 to pattern electrodes 110 and 120 via bumps 108 and 118, respectively. The printed circuit carrier 101 is made of a plurality of wiring pattern layers 109.

The material of the printing circuit carrier 101 is generally glass-epoxy in order to provide a multi-layer structure of the carrier. Therefore, the carrier 101 cannot be bent so as to place it within the casing of a small component such as an IC card.

In order to ensure moisture resistance, the semiconductor chips 102, 106 and 116 mounted on the printed circuit carrier 101 cannot be exposed to the atmosphere, but must be sealed by some means, resulting in a large module.

Furthermore, in the conventional multi-chip module such as shown in FIG. 10, the semiconductor chips 102, 106 and 116 are mounted on the surface of the printed circuit carrier 101. It is therefore difficult to mount semiconductor chips three-dimensionally, in the vertical direction, hindering an increase of packaging density.

Still further, a conventional multi-chip module requires a number of manufacturing steps, resulting in increased manufacturing time and cost. The reason for this is that the step of laminating wiring pattern layers 109 of the carrier 101, the step of electrically connecting the semiconductor chips 102, 106 and 116 to the carrier 101, and the step of sealing the semiconductor chips 102, 106 and 116, are independently carried out.

SUMMARY OF THE INVENTION

It is therefore an object of the present invention to provide a thinner semiconductor device having a smaller dimension, an improved packaging density, and high reliability, and to provide a method of manufacturing such a semiconductor device while shortening the manufacturing time and reducing the manufacturing cost.

According to one aspect of the present invention, a semiconductor device is provided which comprises: a plurality of film carriers each having a wiring pattern formed on the surface of the film carrier; and a plurality of semiconductor chips packaged within the plurality of film carriers laminated one upon another, electrode pads of the plurality of semiconductor chips being electrically connected to the wiring patterns on the film carriers.

According to another aspect of the present invention, a semiconductor device is provided which comprises: a plurality of film carriers each having a wiring pattern formed on the surface of the film carrier and holes formed at the position where viahole connections are necessary, each film carrier being made of thermoplastic resin and a plurality of semiconductor chips packaged within the plurality of film carriers laminated one upon another and hardened through heating and compression, the electrode pads of the plurality of semiconductor chips being electrically connected directly to the wiring patterns, or via the viaholes.

According to another aspect of the present invention, a method of manufacturing a semiconductor device is provided which comprises the steps of: forming a wiring pattern printed with conductive paste on each of a plurality of film carriers, and forming holes at the position where viahole connections are necessary; and laminating the plurality of semiconductor chips, heating and compressing the laminated film carriers within which semiconductor chips are packaged with electrode pads of the semiconductor chip being aligned to the wiring pattern, to perform at the same time the processes of laminating the film carriers, electrically connecting the semiconductor chip to the film carriers, and sealing the semiconductor chip.

According to the semiconductor device of the present invention, semiconductor chips are packaged within laminated film carriers. Therefore, the enclosure of the semiconductor device is very thin and compact. The enclosure is made of film carriers, so that the device is flexible and bendable. The semiconductor chips are sealed within very thin film carriers, so that the device has excellent moisture resistance and heat dissipation.

According to the method of manufacturing a semiconductor device of the present invention, the process of laminating film carriers, the process of electrically connecting semiconductor chips and film carriers, and the process of sealing the semiconductor chips can be carried out at the same time, shortening the manufacturing time and reducing the manufacturing cost.

DESCRIPTION OF THE PREFERRED EMBODIMENTS

Embodiments of the present invention will be described with reference to the accompanying drawings.

Figure 1:
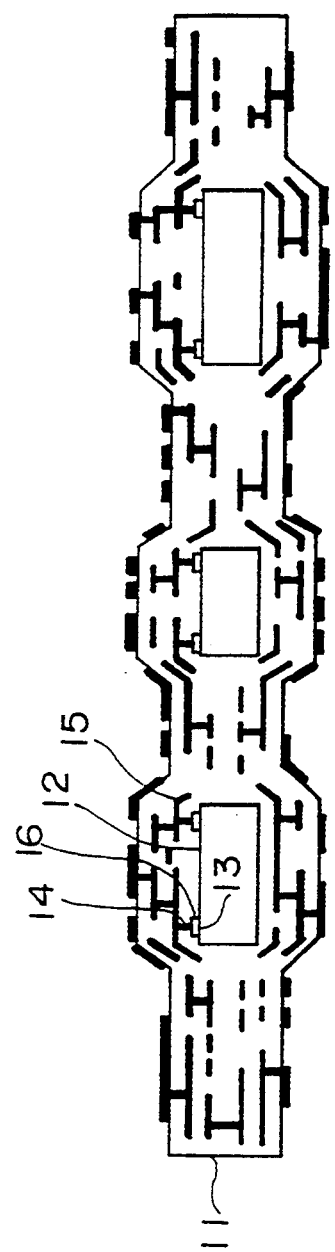
FIG. 1 is a cross sectional elevation showing the package structure of a semiconductor device according to a first embodiment of the present invention.

A multi-chip module according to the first embodiment of the present invention has the package structure shown in FIG. 1, A plurality of semiconductor chips 12 are held in position within a multi-layer film carrier 11, A bump 16 is formed on an electrode pad 13 of each semiconductor chip 12, The semiconductor chip 12 and the multi-layer film carrier 11 are electrically connected through direct connection between the wiring pattern layer 15 within the multi-layer film carrier 11 and the bump 16 of the semiconductor chip 12, or through connection therebetween via holes to be described later.

Figure 2A:
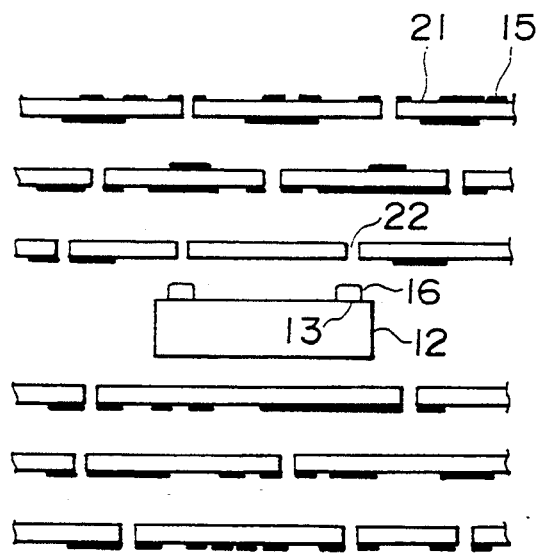
FIGS. 2A and 2B are cross sectional elevations showing the steps of manufacturing the semiconductor device of the first embodiment of the present invention.
Figure 2B:
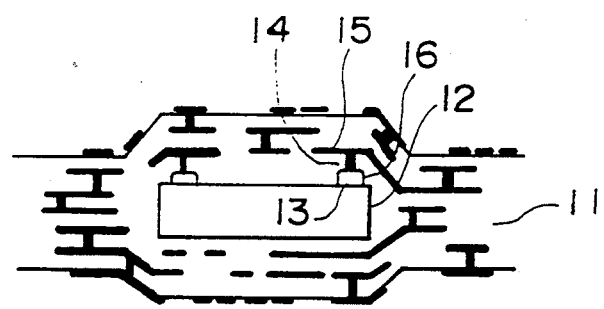

The multi-chip module described above can be manufactured by the following method. FIGS. 2A and 2B are cross sectional elevations showing the steps of manufacturing the semiconductor device. As shown in FIG. 2A, a single-layer film carrier 21 is made of a thermoplastic resin film the film having a wiring pattern layer 15 printed with conductive paste. The single-layer film carrier 21 is formed with holes 22 at the positions where viahole connections are necessary.

A bump 16 is formed on the electrode pad 13 of the semiconductor chip 12. The bump 16 is made of metal and can be formed by plating, etc. A plurality of semiconductor chips 12 are placed between single-layer film carriers, 21, with bumps 16 and wiring pattern 15 being aligned, so as to be electrically connected.

The single-layer film carriers 21 with the plurality of semiconductor chips 12 being sandwiched therebetween are subject to heating and compression. As a result, the single-layer film carriers 21 are physically compressed and attached together. The semiconductor chip 12 and the single-layer film carrier 21 are electrically connected through attachment of the bumps 16 to the wiring pattern layer 15.

Figure 3:
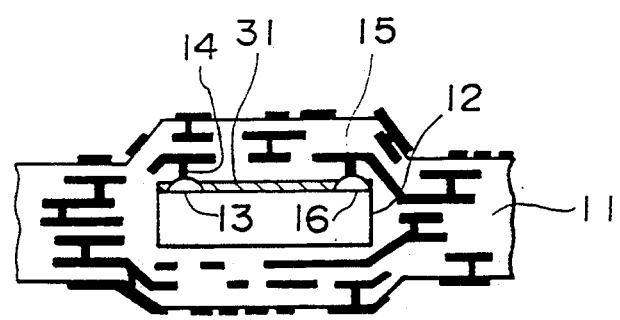
FIG. 3 is a cross sectional elevation showing the package structure of a semiconductor device according to a second embodiment of the present invention.

FIG. 3 is a cross sectional elevation of a multi-chip module according to the second embodiment of the present invention. The second embodiment differs from the first embodiment in that an insulating protective film 31 is formed on the surface of semiconductor chip 12. The film 31 reliably protects the surface of the semiconductor chip 12 to thereby improve moisture resistance. The material of the insulating protective film 31 may be polyimide, silicon, or the like. The other components represented by identical reference numerals to the first embodiment are the same as the first embodiment, so the description thereof is omitted. The method of manufacturing such a semiconductor device is the same as the first embodiment except that the insulating protective film 31 is formed on the semiconductor chip 12.

Figure 4:
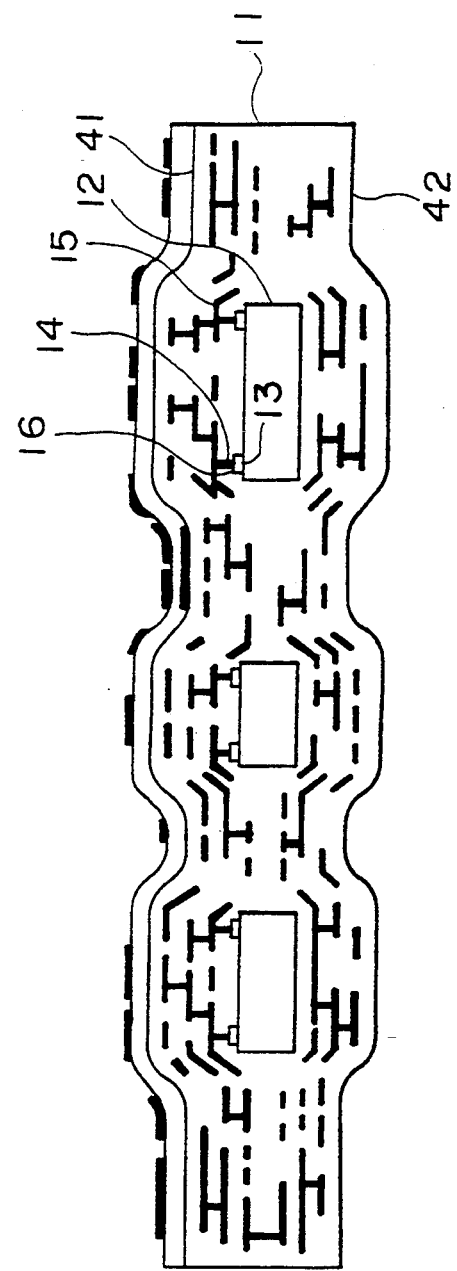
FIG. 4 is a cross sectional elevation showing the package structure of a semiconductor device according to a third embodiment of the present invention.

The third embodiment of the present invention will be described. The package structure of the multi-chip module of this embodiment is shown in FIG. 4. Ground layers 41 and 42 made of conductive thin films are formed on the upper and lower layers of film carriers sandwiching semiconductor chips 12. The ground layers 41 and 42 are shielded from external electromagnetic waves which may degrade the electrical performance of the device.

Figure 5:
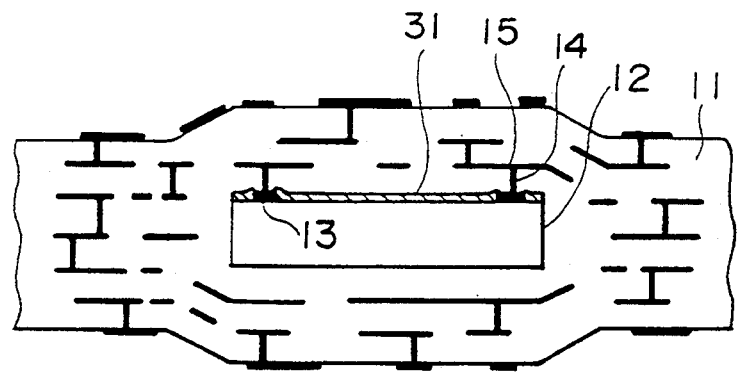
FIG. 5 is a cross sectional elevation showing the package structure of a semiconductor device according to a fourth embodiment of the present invention.

FIG. 5 shows a multi-chip module according to the fourth embodiment of the present invention. In the first to third embodiments, a bump is formed on an electrode pad of a semiconductor chip. In the fourth embodiment, without using a bump, an electrode pad 13 and the wiring pattern layer 15 of a multi-layer film carrier 11 are directly connected via viaholes. In this embodiment, similar to the second embodiment, the surface of a semiconductor chip 12 is covered with an insulating protective film 31.

Figure 6:
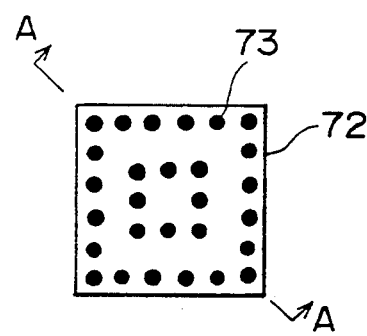
FIG. 6 is a plan view showing the positions of electrode pads of a semiconductor chip packaged within the semiconductor device of a fifth embodiment of the present invention.
Figure 7:
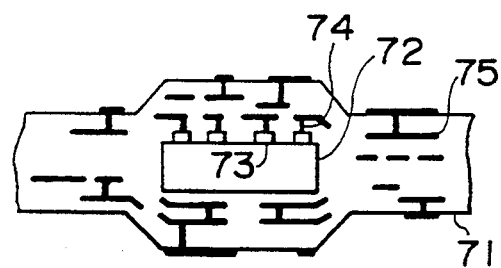
FIG. 7 is a cross sectional elevation showing the package structure of a semiconductor device according to the fifth embodiment of the present invention.

Next, the fifth embodiment will be described, wherein a semiconductor chip 72, having electrode pads 73 disposed as shown in FIG. 6, is assembled. A cross sectional elevation of the module assembled with such a semiconductor chip 72 and taken along line A—A is shown in FIG. 7. All electrode pads 73 on the semiconductor chip 72 and a wiring pattern layer 75 in a multi-layer film carrier 71 are connected via viaholes 74. This embodiment is also suitable for application to a multi-chip module assembled with the semiconductor chip 72 having a number of electrode pads 73.

Figure 8:
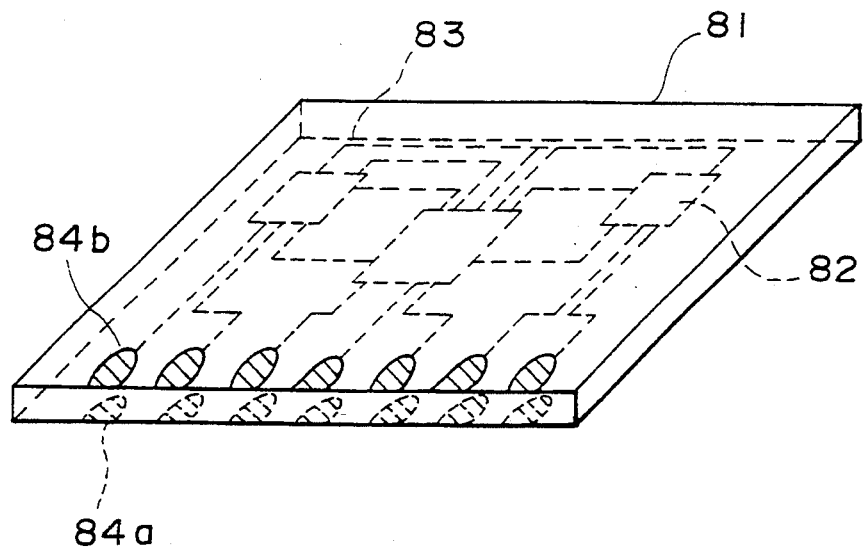
FIG. 8 is a cross sectional elevation showing the package structure of a semiconductor device according to a sixth embodiment of the present invention.

FIG. 8 is a perspective view showing a multi-chip module according to the sixth embodiment of the present invention. A plurality of semiconductor chips 82 and wiring pattern layers 83 electrically connected together are sealed within the module. A multi-layer film carrier 81 is mounted with terminal electrodes 84a and 84b of the plug-in type allowing simple connection to an external device.

Figure 9:
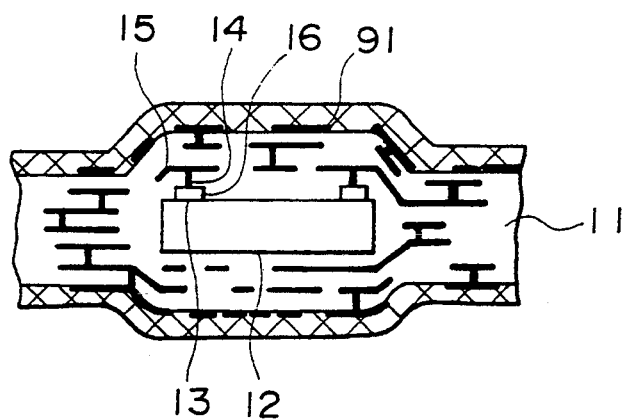
FIG. 9 is a cross sectional elevation showing the package structure of a semiconductor device according to a seventh embodiment of the present invention.
Figure 10:
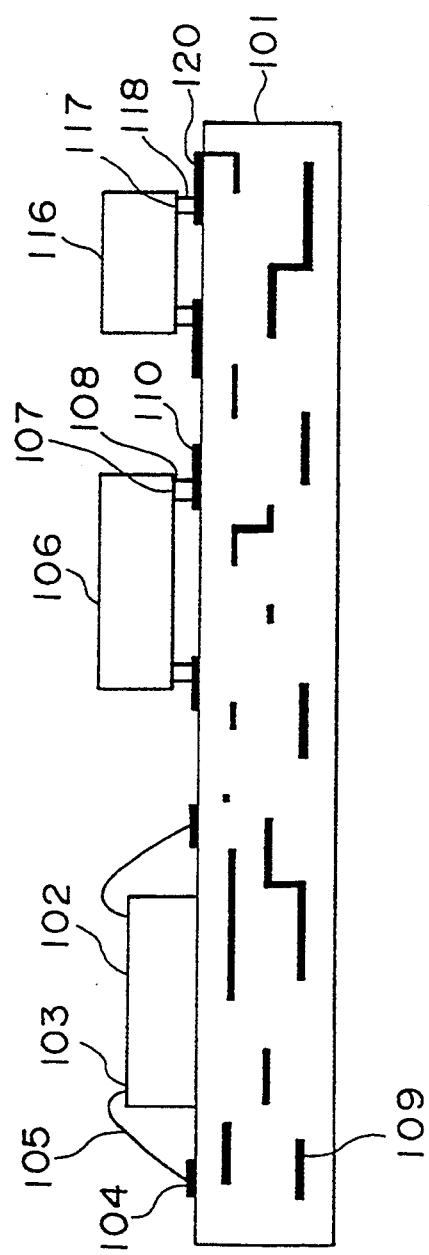
FIG. 10 is a cross sectional elevation showing the package structure of a conventional semiconductor device.

In order to shield from external radioactive rays which may degrade the performance of a semiconductor chip, the seventh embodiment shown in FIG. 9 coats the surface of a multi-layer film carrier 91, with radioactive ray shielding resin.

In the above embodiments, very thin single-layer film carriers are stacked one upon another to assemble semiconductor chips within the carriers. Therefore, a thin and flexible multi-chip module can be realized, and can be bent to accommodate it within a small casing. In the above embodiments, semiconductor chips are disposed in a horizontal plane. Semiconductor chips may be disposed superposed one upon another in the vertical plane. Such three-dimensional disposal considerably improves the assembly density.

Furthermore, since semiconductor chips are sealed within very thin multilayer printed film carriers, the chips are bare, providing excellent heat dissipation. If a liquid cooling system is used, very great cooling effect can be expected.

According to the manufacturing method of the embodiments, the process of laminating wiring pattern layers, the step of electrically connecting semiconductor chips to film carriers, and the step of sealing semiconductor chips, can be performed at the same time by only one thermal pressing process. As a result, the number of manufacturing steps is reduced while shortening manufacturing time and reducing manufacturing cost.

The above-described embodiments have been given by way of example only, and they are not intended to limit the scope of the present invention. The bump on an electrode pad may use any material so long as it allows connection to a wiring pattern layer in the multi-layer film carrier.

What is claimed is:

1. A method of manufacturing a semiconductor device comprising the steps of:

forming a wiring pattern by printing conductive paste on each of a plurality of film carriers, and forming holes at the position where viahole connections are necessary; and laminating said plurality of semiconductor chips, heating and compressing said laminated film carriers within which semiconductor chips are packaged with electrode pads of said semiconductor chips being aligned to said wiring pattern, to perform at the same time the processes of laminating said film carriers, electrically connecting said semiconductor chips to said film carriers, and sealing said semiconductor chips.

2. A method of manufacturing a semiconductor device comprising the steps of:

forming wiring patterns by using conductive paste on a first, second and third plastic film;

forming holes in the second plastic film at positions where via hole connections are to be made;

laminating the first, second and third plastic films by heating and pressurizing them into a flexible state in which a plurality of semiconductor chips having electrode pads are interposed between the second plastic film and the third plastic film, and the electrode pads of the semiconductor chips are connected electrically to the wiring patterns of the first plastic film through the holes in the second plastic film, at the same time electrically connecting the semiconductor chips to the wiring patterns of the first plastic film; and sealing the resulting semiconductor device.

3. A method of manufacturing a semiconductor device according to claim 2, wherein the first, second and third plastic films are laminated into a state in which the electrode pads of at least two said semiconductor chips are electrically connected to each other by the wiring patterns of the first plastic film, through the holes of the second plastic film.

4. A method of manufacturing a semiconductor device according to claim 2, further comprising the step of forming insulating films on the surfaces of the semiconductor chips, except over the electrode pads.

5. A method of manufacturing a semiconductor device according to claim 2, further comprising the step of forming ground layers, made of conductive films, on at least one surface of each of the first and third plastic films.

6. A method of manufacturing a semiconductor device according to claim 2, further comprising the step of forming a plug-in type terminal, which is connected electrically to the wiring patterns of at least one of the first, second and third plastic films, in the area peripheral to the semiconductor device.

7. A method of manufacturing a semiconductor device according to claim 2, further comprising the step of coating the semiconductor device with a resin which shields the external surface of the semiconductor device from radioactive rays.

* * * * *